(12) United States Patent
Tilke

(10) Patent No.: US 9,041,084 B2
(45) Date of Patent: May 26, 2015

(54) MEMORY DEVICE AND METHOD FOR MAKING SAME

(71) Applicant: Infineon Technologies AG, Neubiberg (DE)

(72) Inventor: Armin Tilke, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/924,635

(22) Filed: Jun. 24, 2013

(65) Prior Publication Data

US 2014/0154857 A1    Jun. 5, 2014

Related U.S. Application Data

(62) Division of application No. 12/169,648, filed on Jul. 9, 2008, now Pat. No. 8,476,686.

(51) Int. Cl.
| | | |
|---|---|---|
| *H01L 21/02* | (2006.01) | |
| *H01L 29/66* | (2006.01) | |
| *H01L 27/102* | (2006.01) | |
| *H01L 27/24* | (2006.01) | |
| *H01L 45/00* | (2006.01) | |

(52) U.S. Cl.
CPC ...... *H01L 29/66242* (2013.01); *H01L 27/1026* (2013.01); *H01L 27/2445* (2013.01); *H01L 45/06* (2013.01); *H01L 45/1233* (2013.01); *H01L 45/144* (2013.01); *H01L 27/2463* (2013.01)

(58) Field of Classification Search
CPC .... H01L 45/06; H01L 45/1233; H01L 45/144

USPC .......................... 257/295, E21.379, E27.004
See application file for complete search history.

(56) References Cited

U.S. PATENT DOCUMENTS

| | | | |
|---|---|---|---|
| 4,504,332 A * | 3/1985 | Shinada | 438/353 |
| 5,089,429 A | 2/1992 | Hsu | |
| 5,285,083 A | 2/1994 | Pulfrey | |
| 6,362,066 B1 * | 3/2002 | Ryum et al. | 438/364 |
| 6,753,562 B1 | 6/2004 | Hsu | |
| 7,141,481 B2 | 11/2006 | Hsu | |
| 7,495,946 B2 | 2/2009 | Gruening-von Schwerin et al. | |
| 7,795,703 B1 * | 9/2010 | U'Ren | 257/565 |
| 7,800,093 B2 * | 9/2010 | Happ et al. | 257/4 |
| 7,875,871 B2 | 1/2011 | Kumar | |
| 8,476,686 B2 | 7/2013 | Tilke | |
| 2001/0003667 A1 | 6/2001 | Ahn et al. | |
| 2002/0100917 A1 | 8/2002 | Chu et al. | |
| 2003/0001235 A1 | 1/2003 | Hashimoto | |
| 2005/0010917 A9 | 1/2005 | Rajaram et al. | |
| 2005/0023656 A1 | 2/2005 | Leedy | |
| 2005/0098811 A1 | 5/2005 | Ogiwara | |
| 2007/0034921 A1 | 2/2007 | Daley et al. | |
| 2007/0173010 A1 | 7/2007 | Lee et al. | |
| 2008/0014733 A1 | 1/2008 | Liu | |

\* cited by examiner

*Primary Examiner* — John C Ingham
(74) *Attorney, Agent, or Firm* — Slater & Matsil, L.L.P.

(57) ABSTRACT

Embodiments relate to a method of forming a memory array, comprising: forming a collector layer; forming a plurality of collector regions in the collector layer; forming a plurality of base regions over the collector region; forming a plurality of emitter regions over the base regions; forming a plurality of memory elements over the emitter regions, wherein the collector regions, base regions and emitter regions form heterojunction bipolar transistors.

20 Claims, 9 Drawing Sheets

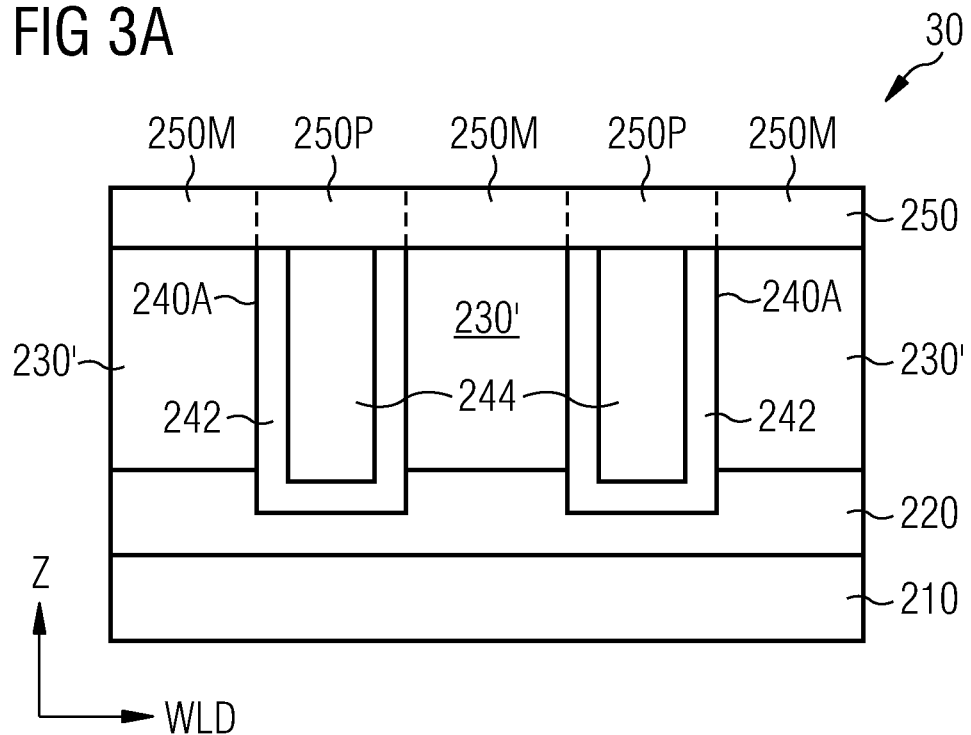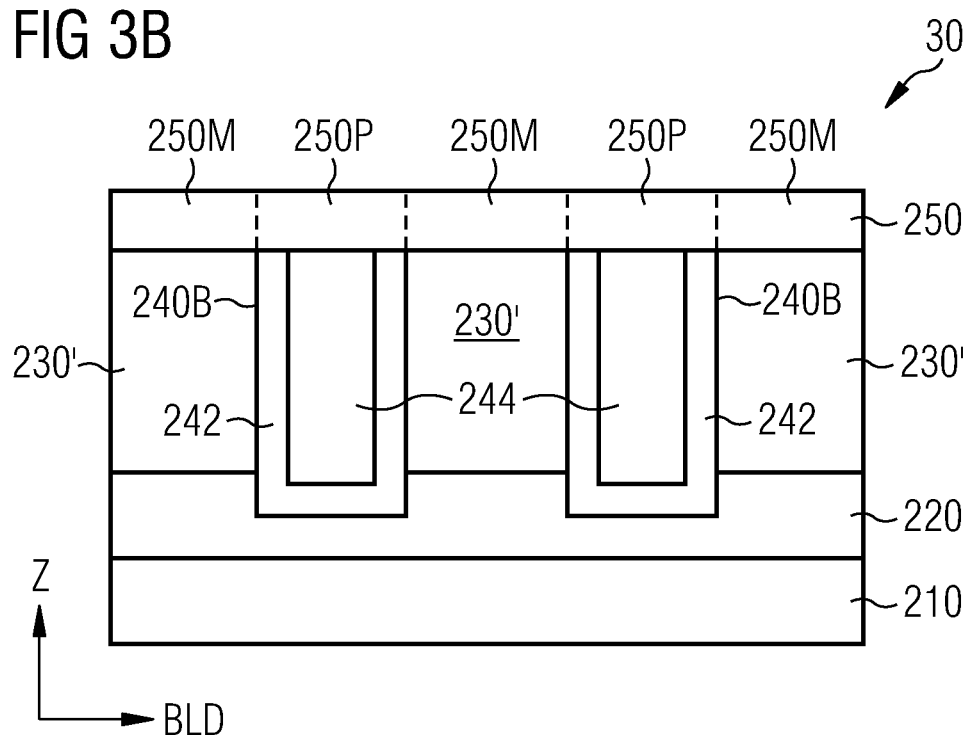

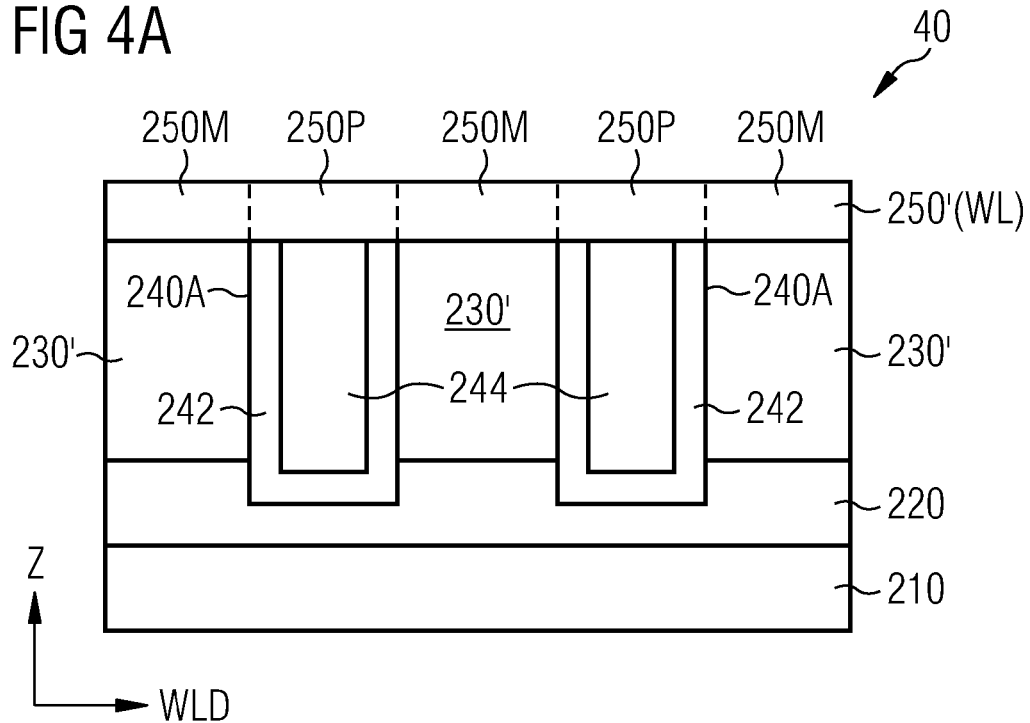
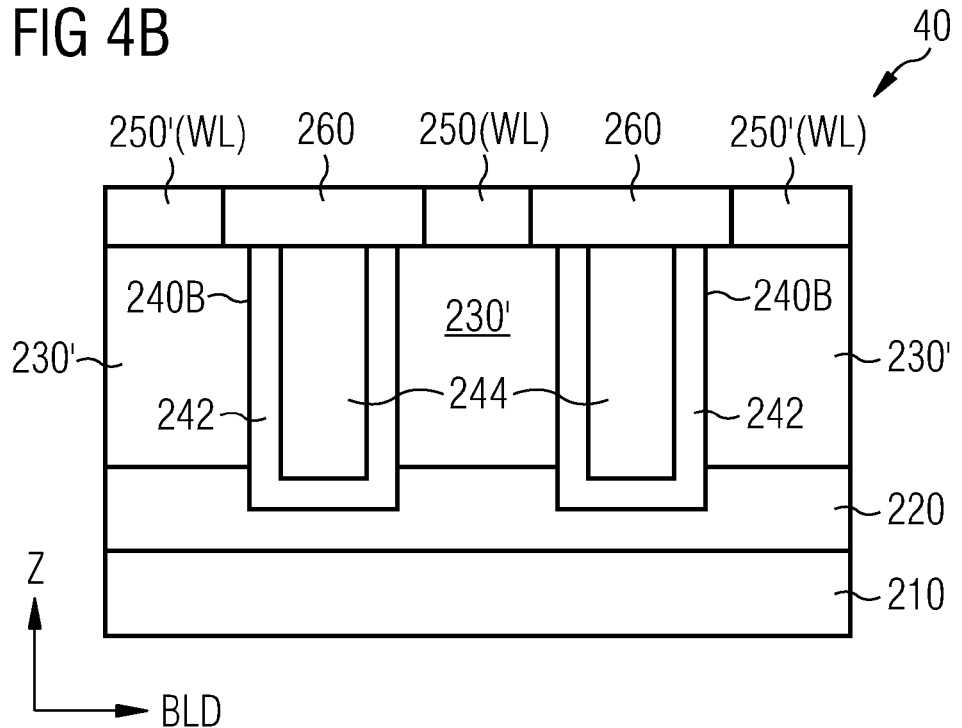

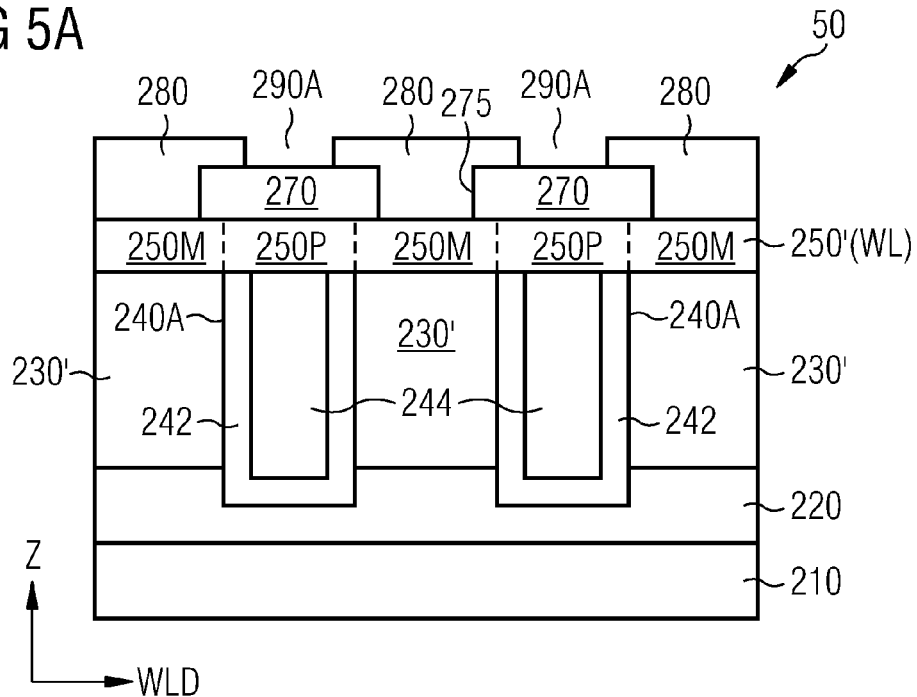
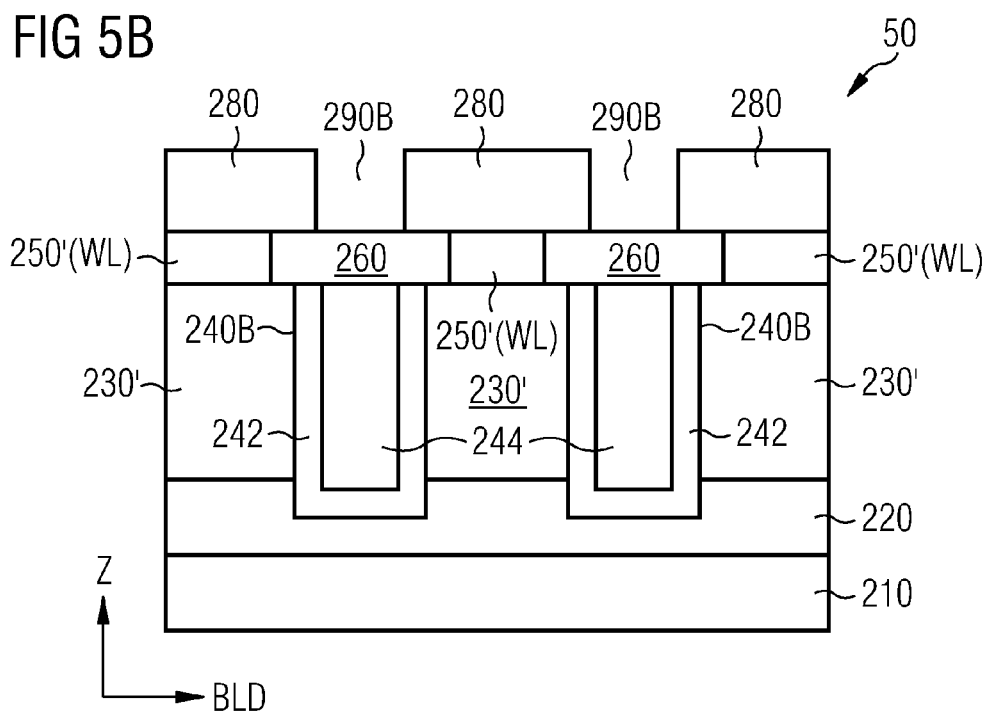

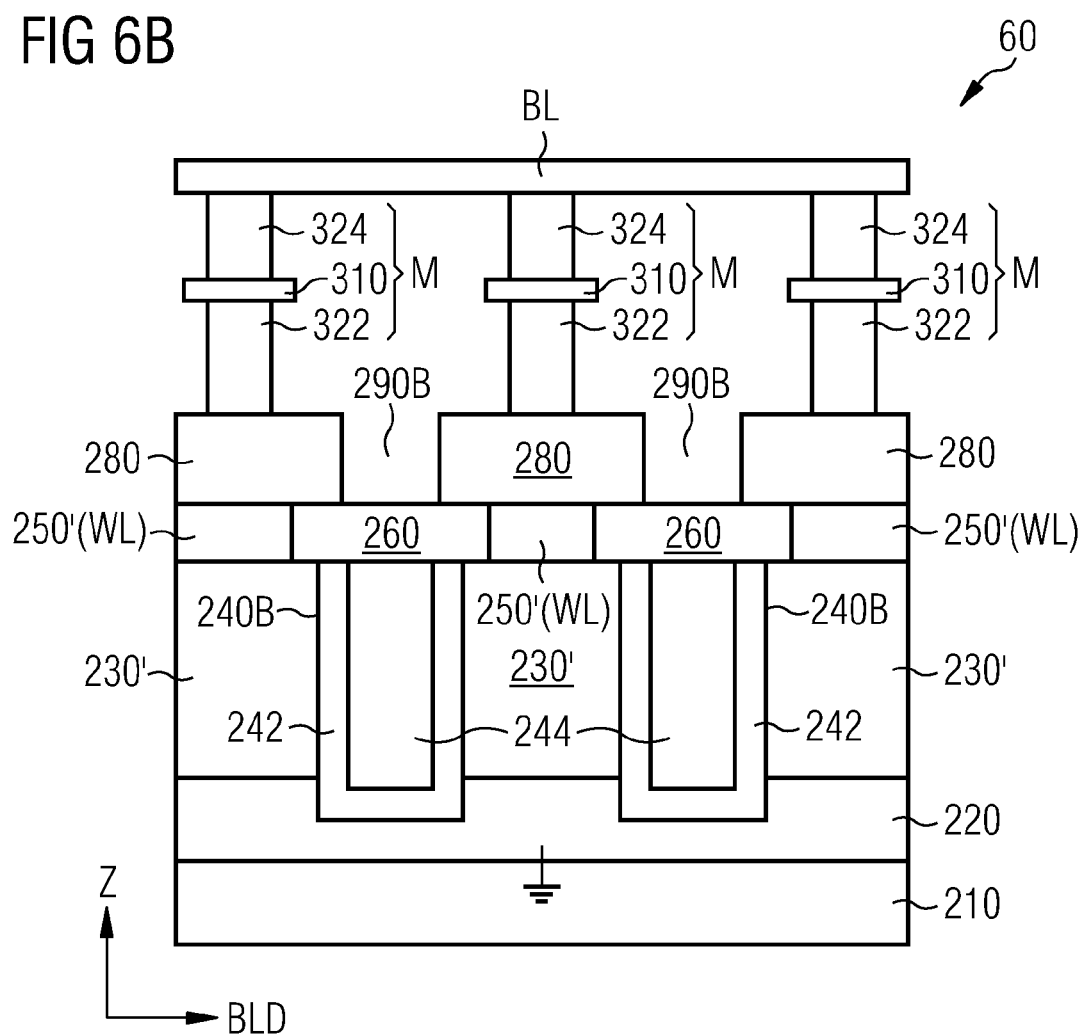

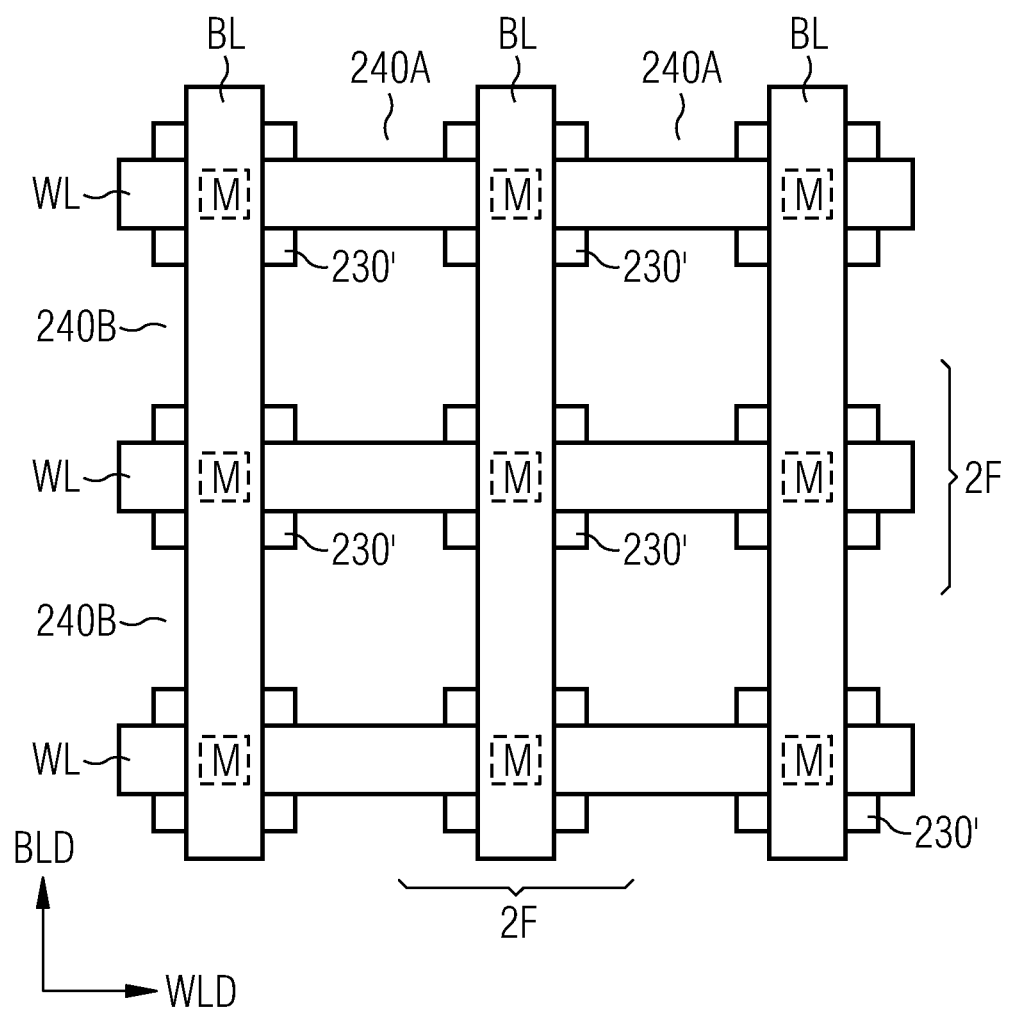

MEMORY DEVICE AND METHOD FOR MAKING SAME

RELATED APPLICATION INFORMATION

This application is a divisional application of U.S. patent application Ser. No. 12/169,648. U.S. patent application Ser. No. 12/169,648 is hereby incorporated by reference herein.

FIELD OF THE INVENTION

Embodiments described herein relate generally to semiconductor devices and more particularly, to devices utilizing programmable resistance materials.

BACKGROUND OF THE INVENTION

Programmable resistance elements may be formed from materials that can be programmed to exhibit at least a first and a second stable ohmic state. Such programmable resistance elements may be programmed to a first resistance state to store, for example, a logic ONE data bit or programmed to a second resistance state to store a logic ZERO data bit.

Programmable resistance elements may, for example, be formed from phase-change materials. Certain phase-change materials (for example, certain chalcogenide materials) are capable of being electrically programmed between a first structural state where, for example, the material is generally in an amorphous condition and a second structural state where, for example, the material is generally in a crystalline condition. The phase-change material exhibits different electrical characteristics depending upon its structural state. For instance, in a crystalline, more ordered, state the material exhibits a lower electrical resistivity than in an amorphous, less ordered state.

SUMMARY OF THE INVENTION

An embodiment of the invention is a memory cell, comprising: a programmable resistance memory element; and a heterojunction bipolar transistor electrically coupled to the memory element. In one or more embodiments, the heterojunction transistor may be a SiGe heterojunction bipolar transistor. In one or more embodiments, the heterojunction bipolar transistor may be a SiGe:C heterojunction bipolar transistor.

An embodiment of the invention is a memory array, comprising: a plurality of memory cells, each of the cells comprising a programmable resistance memory element electrically coupled to a heterojunction bipolar transistor. In one or more embodiments, the heterojunction bipolar transistor may be a SiGe heterojunction bipolar transistor. In one or more embodiments, the heterojunction bipolar transistor may be a SiGe:C heterojunction bipolar transistor.

An embodiment of the invention is a method of forming a memory array, comprising: forming a buried layer over a substrate; forming a collector layer over the buried layer; forming spacedly disposed collector regions by introducing first insulating trenches through the collector layer; forming a base layer over the collector regions and over the first insulating trenches; forming spacedly disposed base strips by introducing second insulating trenches through the base layer; forming spacedly disposed emitter regions over first portions of the base strips overlying the collector regions; and forming memory elements over the emitter regions. In one or more embodiments, the base layer may be a SiGe base layer. In one or more embodiments, the base layer may be a SiGe:C base layer.

BRIEF DESCRIPTION OF THE DRAWINGS

FIGS. 2A and 2B show cross sectional views of a semiconductor structure in accordance with embodiments of the present invention;

FIG. 3A and 3B show cross sectional views of a semiconductor structure in accordance with embodiments of the present invention;

FIG. 4A and 4B show cross sectional views of a semiconductor structure in accordance with embodiments of the present invention;

FIG. 5A and 5B show cross sectional views of a semiconductor structure in accordance with embodiments of the present invention;

FIG. 6A and 6B show cross sectional views of a semiconductor structure in accordance with embodiments of the present invention;

FIG. 7 show a top view of an embodiment of memory array of the present invention.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
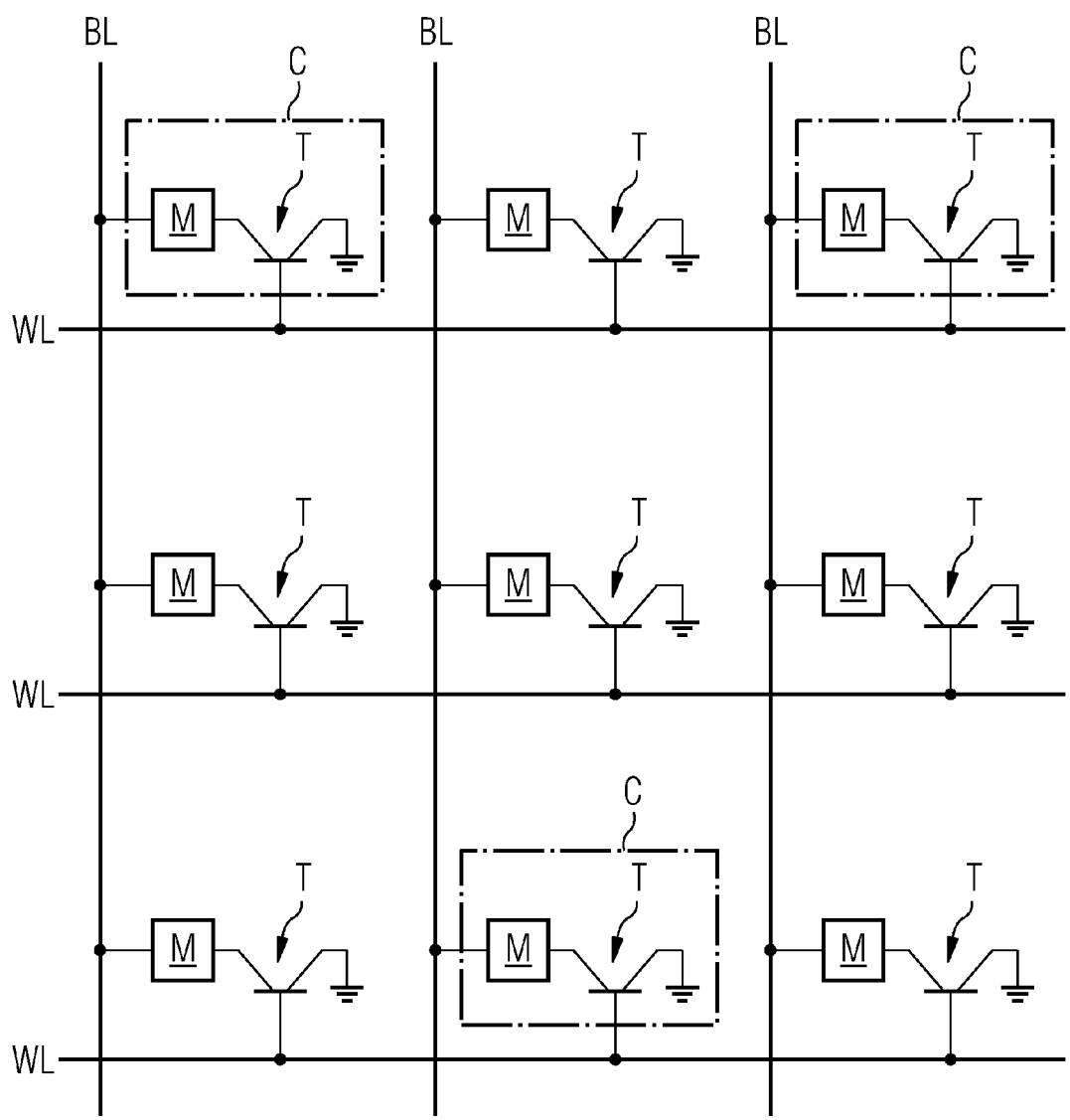
FIG. 1 shows a schematic diagram of an embodiment of a memory array of the present invention.

FIG. 1 shows a schematic view of an embodiment of a memory array of the present invention. The memory array shown is a three by three memory array having three bitlines BL as well as three wordlines WL. In one or more embodiments the array may be arranged in a NOR architecture. The memory array includes nine memory cells C. Each of the memory cells C comprises at least a phase-change memory element M electrically coupled to a bipolar transistor T. The bipolar transistor T serves as an access device for the memory element M. An access device may also be referred to as a selection device, a steering device or as an isolation device.

As noted, the embodiment shown in FIG. 1 shows a schematic diagram of a three by three memory array. However, more generally, the array may include at least one bitline and at least one wordline. In one or more embodiments, there may be at least two bitlines. In one or more embodiments, there may be at least two wordlines. In one or more embodiments, the bipolar transistor T may be a heterojunction bipolar transistor. In one or more embodiments, transistor T may be an n-p-n transistor. In one or more embodiments, the transistor T may be a p-n-p transistor.

In one or more embodiments, the transistor T may be a heterojunction transistor. In one or more embodiments the transistor T includes a base. In one or more embodiments, the base layer includes the elements Si and Ge. In one or more embodiments the base layer includes the elements Si (silicon), Ge (germanium) and C (carbon). In one or more embodiments, the base layer lacks the element C. In one or more embodiments, the base layer may consist essentially of the elements Si and Ge. In one or more embodiments, the base layer may consist essentially of the elements Si, Ge and C. In one or more embodiments, the base layer may be an alloy of two or more elements. In one or more embodiments, the base layer may be an alloy of three or more elements.

In one or more embodiments, the heterojunction transistor may be a SiGe heterojunction transistor that includes a SiGe base layer. In one or more embodiments, the SiGe base layer may lack the element C (carbon). In one or more embodiments, the SiGe base layer may include the element C (carbon). In one or more embodiments, the base layer is a SiGe:C base layer, in which case, the transistor is a SiGe:C heterojunction transistor. In one or more embodiments, the base layer may be p-type doped. In one or more embodiments, the base layer may be p+ doped.

In the embodiment shown in FIG. 1, the memory element M is electrically coupled in series with the transistor T between the bitline and a ground. The emitter is electrically coupled to the memory element M, the collector is electrically coupled to the ground while the base is electrically coupled to the wordline. It is noted that in another embodiment, the ground may be replaced with a positive voltage or a negative voltage. Hence, in one or more embodiments, the voltage may be a ground voltage. In the embodiment shown, the memory element M is coupled between the transistor and the bitline BL. In another embodiment, it is possible that the transistor T be coupled between a memory element and a bitline. In another embodiment, it is possible that the memory element M is coupled between the transistor and a wordline. In another embodiment, it is possible that the transistor T be coupled between a memory element and a wordline.

Figure 6A:
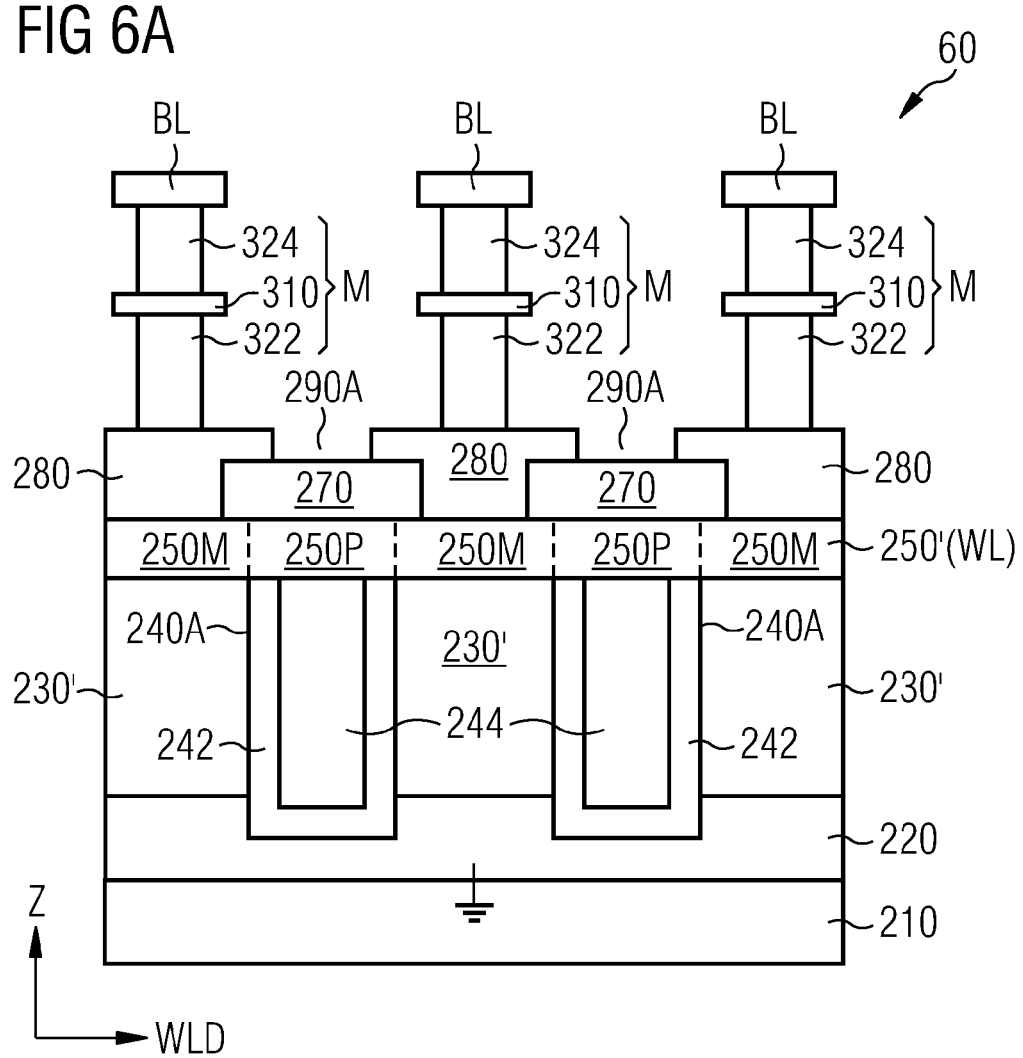

FIGS. 6A,B show cross sectional views of a structure 60 which is an embodiment of a memory array of the present invention. The structure 60 is a memory array including a plurality of memory cells arranged in combination with wordlines WL and bitlines BL. Each of the memory cells comprises a programmable resistance memory element M electrically coupled to a heterojunction bipolar transistor. In one or more embodiments, the heterojunction bipolar transistor may be a SiGe heterobipolar transistor. In one or more embodiments, the heterojunction bipolar transistor may be a SiGe:C heterojunction bipolar transistor. In one or more embodiments, the programmable resistance memory element may be a phase-change memory element. FIG. 6A shows a cross sectional view of the array which is parallel to the wordlines WL and perpendicular to the bitlines BL. This is shown as the WLD-direction. The cross sectional view is through the center of a wordline WL. FIG. 6B shows a cross sectional view which is parallel to the bitlines BL and perpendicutor to the wordlines WL. This is shown as the BLD-direction. The cross sectional view is through the center of a bitline BL. A method for making the structure 60 of FIGS. 6A,B is shown in FIGS. 2A,B through 6A,B. FIGS. 2A, 3A, 4A, 5A and 6A show cross sectional views of structures parallel to the wordlines (in the WLD-direction). FIGS. 2B, 3B, 4B, 5B and 6B show cross sectional views of structures in a direction which is parallel to the bitlines (in the BLD-direction).

FIGS. 2A,B shows a structure 20 comprising a substrate 210. FIG. 2A shows a cross sectional view of a structure 20 parallel to the wordlines (in the WLD-direction). FIG. 2B shows a cross sectional view of a structure 20 parallel to the bitlines (in the BLD-direction). The substrate 210 may be any substrate known in the art. The substrate 210 may be a silicon substrate or other suitable substrate. The substrate may be a silicon-on-insulator (SOI) substrate. The SOI substrate may, for example, be formed by a SIMOX process. In one or more embodiments a bonded SOI or "Smartcut" process may be used. The substrate may be a silicon-on-sapphire (SOS) substrate. In the embodiment shown, the substrate 210 may be a p-type silicon substrate.

The structure 20 may further comprise a buried layer 220 formed over the substrate 210. In one or more embodiments, the buried layer 220 may be formed from an n-type silicon material. The n-type silicon material may be n+ doped. In one or more embodiments, the silicon material may, for example, be a monocrystalline material. The buried layer 220 may serve as a collector connection layer useful to connect the collector regions of the heterobipolar transistors (described below) to a positive voltage, a negative voltage or to ground.

A collector layer 230 may then be formed over the buried layer 220. The collector layer 230 may be formed of an n-type silicon material. The n-type silicon material may be an n– doped silicon material. The silicon material may be a monocrystalline material. The collector layer 230 may be formed by an epitaxial growth process onto the buried layer 220. It is possible that the epitaxial growth process used may be a selective epitaxial growth process.

FIG. 3A shows a structure 30 parallel to the wordlines (in the WLD-direction). FIG. 3B shows a structure 30 parallel to the bitlines (in the BLD-direction). Referring to structure 30 in FIGS. 3A,B, insulating trenches 240A,B are then formed through the collector layer 230 and into an upper portion of the buried layer 220. Insulating trenches 240A,B separate the collector layer 230 into a plurality of spacedly disposed collector regions 230'. Each of the collector regions 230' corresponds to a collector region for one of the bipolar transistor access devices of a memory cell.

Referring to FIG. 3A, insulating trenches 240A are oriented into the page in the BLD-direction. These are parallel to the bitlines and perpendicular to the wordlines. Referring to FIG. 3B, insulating trenches 240B are oriented into the page in the WLD-direction. These are parallel to the wordlines and perpendicular to the bitlines.

It is noted that the insulating trenches 240A,B form a grid. The grid may define a plurality of unit cells. The unit cell defined by the grid may have a cell size of about $4F^2$ or less where F is the feature size. In one or more embodiments, the feature size F may about 1000 Angstroms or less. In one or more embodiments, the feature size F may about 800 Angstroms or less. In one or more embodiments, the feature size F may about 500 Angstroms or less. In one or more embodiments, the feature size F may about 300 Angstroms or less.

In one or more embodiments, the feature size F may be the photolithographic limit of the process being used. In one or more embodiments, the photolithographic limit may be about 1000 Angstroms or less. In one or more embodiments, the photolithographic limit may be about 800 Angstroms or less. In one or more embodiments, the photolithographic limit may be about 500 Angstroms or less. In one or more embodiments, the photolithographic limit may be about 300 Angstroms or less.

Each of the insulating trenches 240A,B may comprise a dielectric material. In the embodiment shown, each of the insulating trenches 240A,B comprises a liner portion 242 and a filler portion 244. The liner portion 242 may comprise a dielectric such as an oxide, a nitride, an oxynitride or combinations thereof. As an example, the liner portion 242 may be an oxide such as a silicon oxide (for example, silicon dioxide). The filler portion 244 may comprise a dielectric material such as an oxide, a nitride, an oxynitride or combinations thereof. As an example, the dielectric material of the filler portion 244 may be an oxide such as a BSG oxide material (e.g. a boron-doped silicon oxide material). In another embodiment, the filler portion 244 may comprise a silicon material such as an amorphous silicon, a monocrystalline silicon or a polycrystalline silicon material. In one or more embodiments, the trenches 240A,B may formed by shallow trench isolation (or STI) processes.

Referring to FIGS. 3A,B, a base layer 250 may then be formed over the structure. The base layer 250 may be formed over the collector regions 230' as well as over the insulating trenches 240A,B. In one or more embodiments, base layer may be a SiGe base layer. In one or more embodiments, the SiGe base layer may be formed without the element C (carbon). In one or more embodiments, the SiGe base layer may be formed with the element C (carbon). In one or more embodiments, the base layer may be a SiGe:C base layer. In one or more embodiments, the base layer may p-type doped. In one or more embodiments, the base layer 250 may be p+ type doped.

Examples of base layers include, without limitation, SiGe base layer such as p-type SiGe base layers and p+ type SiGe base layers. The SiGe base layers may be formed with or without the addition of the element carbon. Further examples of base layers include SiGe:C base layers such as p-type SiGe:C base layers and p+ type SiGe:C base layers.

In one or more embodiments, a SiGe base layer or a SiGe:C base layer may be formed, for example, by a non-selective (differential) epitaxial deposition process. This deposition process behaves like an epitaxial growth process when the underlying layer is monocrystalline silicon. Hence, the deposition process may be monocrystalline when the underyling layer is monocrystalline silicon. The deposition process may be polycrystalline on underlying oxide layers. Hence, referring to FIGS. 3A,B, according to an embodiment of the invention, the deposition process may form monocrystalline SiGe (or SiGe:C) regions 250M over the monocrystalline collector regions 230'. Likewise, the deposition process may form polycrystalline SiGe (or SiGe:C) regions 250P over the insulating trenches 240A,B which may be formed using one or more oxide materials.

A SiGe or SiGe:C epitaxy may be formed to reduce boron diffusion and may lead to an increased transistor speed and current amplification. The Ge content in the SiGe epitaxy or SiGe:C epitaxy may also be graded in order to build up an internal drift field for electrons and that again would increase transistor speed and current amplification. The grading may, for example, be that of a non-constant concentration, a concentration that increases from bottom to top of the layer or a concentration that decreases from bottom to top of the layer.

There may be an advantage of using a heterojunction bipolar transistor such as a SiGe or a SiGe:C heterojunction bipolar transistor as an access device for a phase-change element as compared to a field effect transistor and as compared to a conventional bipolar transistor with a Si-base region. For example, it may be beneficial that the current amplification of the transistor be relatively high in order to allow a high drive current for the phase-change element. A field effect transistor may be able to provide only a relatively small drive current so that the transistor size has to be made relatively large, perhaps larger than $4F^2$.

The current amplification of a bipolar transistor may be approximated by the ratio of $N_E W_E / N_B W_B$, with $N_{E,B}$ being the emitter and base doping, respectively, and $W_{E,B}$ being the emitter and base width, respectively. In order to achieve a high current amplification, the base doping should be held low. On the other hand, in order to achieve a low base resistance (which implies a low wordline resistance), the base doping should be made high. The addition of Ge to the base increases the current amplification. Therefore a higher base doping may be retained without reducing the current amplification. The use of a SiGe:C base layer may lead to a steeper boron profile in the base layer, making the effective base width shorter. This may additionally increase the current amplification and allow for a higher base doping.

In one or more embodiments of the invention, individual base regions for corresponding heterojunction transistors may be formed in a self-aligned manner. The self-alignment may be achieved through the out-diffusion of boron atoms from the BSG oxide material of the insulating trenches 240A,B into the polycrystalline regions of 250P of the SiGe or SiGe:C deposition. This boron out-diffusion into the polycrystalline regions 250P may create a p+ type doping of the polycrystalline regions 250P and reduce the resistance of each of the polycrystalline regions 250P so as to form a low-ohmic base connect region over each of the insulating trenches 240A,B. The low-ohmic base connect regions 250P may help to reduce the resistance of each of the wordlines WL that will be formed (as described below) from the base layer 250. It is noted that a p+ doping of the regions 250P may also be achieved via ion implantation through emitter patterning.

FIG. 4A shows a cross sectional view of a structure 40 parallel to the wordlines (in the WLD direction). FIG. 4B shows a cross sectional view of a structure 40 parallel to the bitlines (in the BLD direction). Referring to structure 40 of FIGS. 4A,B, the layer 250 may be divided into a plurality of base strips 250'. This is done by forming one or more (and, possibly, two or more) trench openings within the base layer 250 and filling the trench openings with a dielectric material so as to form one or more (and, possibly, two or more) insulating trenches 260 that extend in the WLD-direction which is parallel to the wordlines and perpendicular to the bitlines. FIG. 4B shows insulating trenches 260 that extend in the WLD-direction which is parallel to the wordlines and perpendicular to the bitlines. The insulating trenches 260 divide the base layer 250 into base strips 250'. Each of the base strips 250' also extend in the WLD-direction which is parallel to the wordlines and perpendicular to the bitlines. In one or more embodiments, the insulating trenches 260 may be formed by a shallow trench isolation (or STI) technique. Each of the base strips 250' forms a wordline WL for the memory array. The base strips 250' overlie those connector regions 230' which are in a common row the memory array. Each of the base strips 250' includes alternating monocrystalline regions 250M and polycrystalline regions 250P. Each of the monocrystalline regions 250M overlies a collector region 230' and forms the base region for a corresponding transistor. Each of the base regions 250M are electrically coupled together through the polycrystalline regions 250P. Hence, each of the base strips 250' form a common base and common wordline for the transistors disposed within a common row of a memory array.

FIG. 5A shows a cross sectional view of a structure 50 parallel to the wordlines (in the WLD direction). FIG. 5B shows a cross sectional view of a structure 50 parallel to the bitlines (in the BLD direction). Referring to structure 50 of FIGS. 5A,B, after the formation of the base strips 250', a dielectric layer 270 is formed over the base strips 250' (where each of the base strips 250' also represents a wordline) as well as over the isolation trenches 260. Trench openings 275 are formed in the dielectric layer 270 parallel to the BLD-direction so as to run parallel to the bitlines and perpendicular to the wordlines 250'. Emitter regions 280 are formed within the trench openings 275 by depositing an emitter material and etching trench openings 290A through the emitter material in a direction parallel to the BLD-direction so as to run parallel to bitlines. This is shown in FIG. 5A. Referring to FIG. 5B, it is seen that trench openings 290B are also formed through the emitter material 280 in the WLD-direction which is parallel to the wordlines 250'.

In one or more embodiments, the emitter regions 280 may comprise an n-doped polysilicon. In one or more embodiments, the emitter regions 280 may be formed as a heavily n+ doped silicon layer such as a heavily n+ doped polysilicon layer. In one or more embodiments, the polysilicon may be doped in-situ. The emitter regions may be formed, for example, from a heavily arsenic-doped material or from a heavily phosphorus-doped material. The emitter regions 280 may, optionally, comprise a silicide top layer which may reduce the lateral resistance of the emitter regions 280.

FIG. 6A shows a cross sectional view of a structure 60 parallel to the wordlines (in the WLD-direction). FIG. 6B shows a cross sectional view of a structure 60 parallel to the bitlines (in the BLD-direction). Referring to structure 60 of FIGS. 6A,B, it is seen that memory elements M are formed so that each memory element M overlies and makes electrical contact with a corresponding emitter region 280.

In the embodiment shown in FIGS. 6A,B, the memory elements M are programmable resistance memory elements that include a programmable resistance material 310, a first electrode 322 electrically coupled to the programmable resistance material 310 and a second electrode 324 electrically coupled to the programmable resistance material 310. The first electrode 322 is electrically coupled between the programmable resistance material 310 and the emitter region 280. The second electrode 324 is electrically coupled between the programmable resistance material 310 and the bitline BL.

In one or more embodiments, referring to FIGS. 6A,B, it is seen that the buried layer 220 electrically couples all of the individual collector regions 230' of each of the transistors to a common ground. In one or more embodiments, the collector regions 230' may instead be coupled to a common positive or negative voltage.

FIG. 7 shows a top view of an embodiment of a memory array of the present invention. FIG. 7 shows bitlines BL and wordlines WL. The bitlines BL (oriented in the BLD-direction) are spaceldy disposed from each other. Likewise, the wordlines WL (oriented in the WLD-direction) are spacedly disposed from each other. In one or more embodiments, the wordlines WL shown in FIG. 7 correspond to base strips 250' shown in FIGS. 6A,B. In one or more embodiments, the collector regions 230' shown in FIG. 7 correspond to the collector regions 230' shown in FIGS. 6A,B. In one or more embodiments, the isolating trenches 240A,B shown in FIG. 7 correspond to the isolating trenches 240A,B shown in FIGS. 6A,B. In the embodiment of the memory array shown in FIG. 7, the collector regions 230' are spacedly disposed from each other by the isolating trenches 240A,B.

In the embodiment shown in FIG. 7, the dimension of a memory cell in the WLD-direction is a distance of 2F. This distance of 2F represents the distance between the center of one isolating trench 240A and the center of an adjacent trench 240A. It may also represent the distance between the center of one bitline BL to the center of an adjacent bitline BL. In one or more embodiments, the dimension of a memory cell in the WLD-direction may be 2F or below. F may be referred to as the feature size of the array.

Likewise, still referring to FIG. 7, the dimension of a memory cell in the BLD-direction is also a distance of 2F. This is the distance from the center of an insulating trench 240B to the center of an adjacent insulating trench 240B. This may also be the distance from the center of a wordline WL to the center of an adjacent wordline WL. In one or more embodiments, the dimension of a memory cell in the BLD-direction may be 2F or below. Hence, the total cell size may be $4F^2$ or below.

An embodiment of the invention is a bipolar transistor having a cell size of $4F^2$ or below. In an embodiment, the bipolar transistor may be a heterojunction bipolar transistor. In an embodiment, the heterojunction bipolar transistor may be a SiGe heterojunction transistor. In an embodiment, the heterojunction bipolar transistor may be a SiGe:C bipolar transistor.

In one or more embodiments, the feature size F may be the photolithographic limit of the process used to make the memory array. In one or more embodiments, the feature size F may be about 1000 Angstroms or below. In one or more embodiments, the feature size F may be about 700 Angstroms or below. In one or more embodiments, the feature size F may be about 500 Angstroms or below. In one or more embodiments, the feature size F may be about 300 Angstroms or below. In one or more embodiments, the feature size F may be about 250 Angstroms or below.

In one or more embodiments, the size of the memory cell of the present invention in the WLD-direction may be about 2000 Angstroms or below. In one or more embodiments, the size of the memory cell in the WLD-direction may be about 1400 Angstroms or below. In one or more embodiments, the size of the memory cell in the WLD-direction may be about 1000 Angstroms or below. In one or more embodiments, the size of the memory cell of the present invention may be about 600 Angstroms or below. In one or more embodiments, the size of the memory cell of the present invention may be about 500 Angstroms or below.

In one or more embodiments, the size of the memory cell of the present invention in the BLD-direction may be about 2000 Angstroms or below. In one or more embodiments, the size of the memory cell in the BLD-direction may be about 1400 Angstroms or below. In one or more embodiments, the size of the memory cell in the BLD-direction may be about 1000 Angstroms or below. In one or more embodiments, the size of the memory cell in the BLD-direction may be about 600 Angstroms or below. In one or more embodiments, the size of the memory cell in the BLD-direction may be about 500 Angstroms or below.

In one or more embodiments, the size of the memory cell of the present invention may be about 400E+4 square Angstroms or below. In one or more embodiments, the size of the memory cell may be about 196E+4 square Angstroms or below. In one or more embodiments, the size of the memory cell may be about 100E+4 square Angstroms or below. In one or more embodiments, the size of the memory cell may be about 36E+4 square Angstroms or below. In one or more embodiments, the size of the memory cell may be about 25E+4 square Angstroms or below.

The structure 60 shown in FIGS. 6A,B shows an embodiment of a memory array comprising programmable resistance elements as the memory elements and heterojunction bipolar transistors as the access devices. In one or more embodiments, the heterojunction bipolar transistor may be a SiGe heterojunction bipolar transistor that includes a SiGe base layer. In one or more embodiments, the heterojunction bipolar transistor may be a SiGe:C heterojunction bipolar transistor that includes a SiGe:C base layer.

In one or more embodiments, the SiGe base layer may have the atomic composition $Si_{1-x}Ge_x$ where X is greater than 0 and less than 1. In one or more embodiments, the SiGe base layer may lack C (the element carbon). In one or more embodiments, the SiGe base layers may include C (the element carbon).

In one or more embodiments of the invention, the base layer of the heterojunction bipolar transistor may be a SiC base layer.

In one or more embodiments of the invention the base layer of the heterojunction bipolar transistor may comprise Si (the element silicon) and Ge (the element germanium). In one or more embodiments, the base layer may comprise C (the element carbon). In one or more embodiments, the base layer may comprise Si, Ge and C (the elements silicon, germanium and carbon). In one or more embodiments, the base layer may comprise an alloy of two or more elements. In one or more embodiments, the base layer may comprise a binary alloy or compound.

In one or more embodiments, the base layer may comprise a tertiary alloy or compound. In one or more embodiments, the base layer may be doped with a p-type dopant (such as boron). In one or more embodiments, the base layer may be p+ type doped. In one or more embodiments, the base layer may comprise a composite material (for example, the base layer may comprise two or more regions or sub-layers). In one or more embodiments, the base layer may comprise a graded material (for example, the graded material may have a graded composition). In one or more embodiments, the bipolar heterojunction transistor may be an n-p-n transistor. In one or more embodiments, the bipolar heterojunction transistor may be a p-n-p transistor. In one or more embodiments, any heterojunction bipolar transistor may be used as the access device. In one or more embodiments, the heterojunction bipolar transistor may incorporate a heterojunction between a wide bandgap semiconductor and a narrow bandgap semiconductor. Some possible examples of materials used to form the heterojunction include InP/InGaAs, Si/SiGe, Si/SiGe:C, InAlAs/InGaAs, AlGaN/GaN, InGaP/GaAs, InGaP/InGaAsN, AlGaAs/GaAs and InP/GaAsSb. In one or more embodiments, any bipolar transistor may be used as the access device. In one or more embodiments, any transistor may be used as the access device.

The first and second electrodes 320A,B that are shown in FIGS. 6A,B may be formed of any conductive material. Examples of materials which may be used to form the first and second electrodes include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon.

The memory material 310 may be any programmable resistance material. That is may be material which is programmable between at least a first resistance state and a second resistance state. Programming may be accomplished with the use of electrical signals such as electrical currents and voltages.

In one or more embodiments, the programmable resistance material may be a phase-change material. In one or more embodiments, a phase-change material includes those materials which are programmable between at least a first more structurally ordered state (such as a crystalline state) and a second less structurally ordered state (such as a crystalline state). The more ordered state has a lower resistivity than the less ordered state. Materials that may be used as phase-change materials include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy which may be used as a phase-change material is the alloy $Ge_2Sb_2Te_5$.

Figure 8:
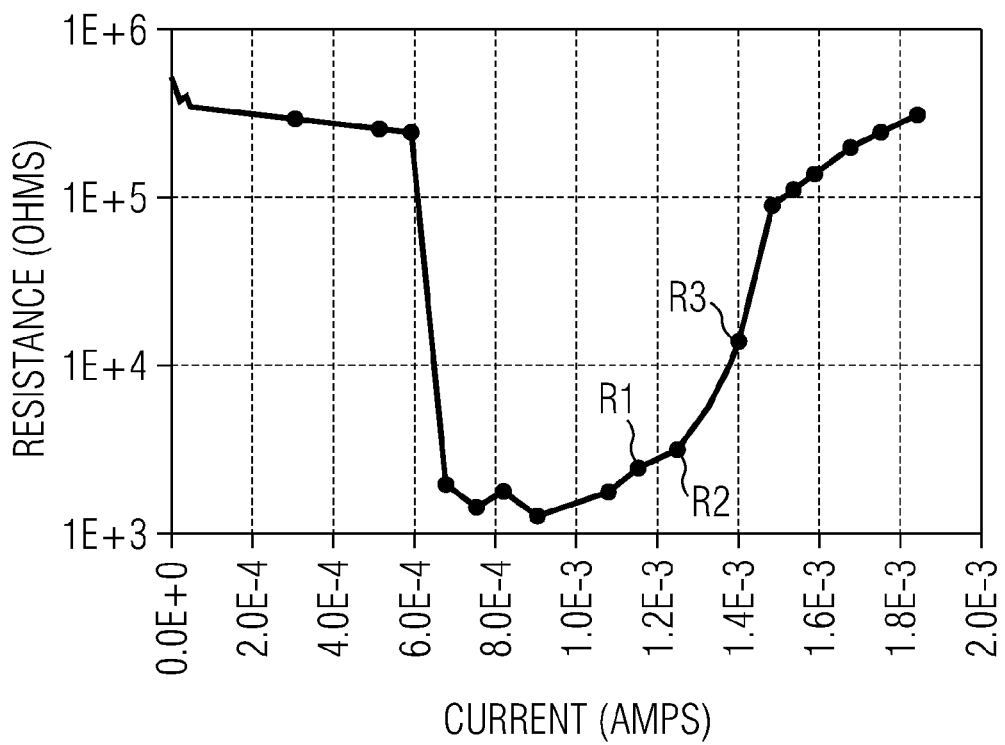
FIG. 8 shows an example of current-resistance plot of an embodiment of a chalcogenide programmable resistance memory element.

FIG. 8 is an example of a plot of the resistance of a chalcogenide phase-change element versus the amplitude of a current pulse through the phase-change element. Referring to FIG. 8, several different programming regimes can be distinguished. In the left side of the curve, the resistance of the phase-change element remains substantially constant (e.g., in its high resistance or RESET state) until a current pulse of sufficient energy is applied. The phase-change element is then programmed from its high resistance (RESET) state to its low resistance (SET) state. The current pulse sufficient to program the phase-change element from the high resistance state to the low resistance state is referred to as a "set pulse". While not wishing to be bound by theory, it is believed that the set pulse is sufficient to change at least a portion of the phase-change element from a less-ordered (for example, amorphous) state to a more-ordered (for example, crystalline) state.

The phase-change element may be programmed back from the low resistance state or SET state to the high resistance or RESET state by applying a current pulse of sufficient amplitude, referred to as a "reset pulse".

While not wishing to be bound by theory, it is believed that application of a reset pulse to the phase-change element is sufficient to change at least a portion of the phase-change element from a more-ordered (for example) crystalline state to a less-ordered (for example, amorphous) state. The phase-change element may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 8, as the amplitude of the current through the phase-change element increases, the resistance of the element increases. This increase is both gradual and reversible. In this regime, the chalcogenide phase-change element may be programmed to any resistance value within a window of resistance values bounded by the low resistance or SET state and the high resistance or RESET state. More specifically, in this regime along the right side of the curve, the phase-change element may be programmed from any one of the resistance states on the right side of the resistance curve to any other of the resistance states on the right side of the curve by the application of an electrical signal. The electrical signal may be a current pulse of sufficient amplitude. The phase-change element may also be programmed between three or more resistance values within the resistance window so as to provide for multi-state data storage. The data storage may be directly overwritable. While not wishing to be bound by theory, it is believed that each of the resistance states along the right side of the curve may correspond to a particular ratio of the volume of crystalline material to the volume of amorphous material in an active region of the chalcogenide material. Three intermediate resistance states R1, R2 and R3 are shown in the resistance curve of FIG. 8.

In one or more embodiments of the invention, the phase-change element may be formed from a phase-change material that is not a chalcogenide material. For example, the phase-change material may be any material which can be programmed between a structurally less ordered state and a structurally more ordered state. The structurally less ordered state may be an amorphous state while the structurally more ordered state may be a crystalline state.

In yet other embodiments of the invention, it is also possible that devices be formed from programmable resistance materials that are not phase-change materials. For example, a programmable resistance material may be any material which is programmable between at least a first resistance state and a second resistance state. The programming means may, for example, be an electrical signal or electrical energy. However, other forms of signals and energy may also be used. Other examples include thermal energy, optical energy and mechanical energy.

While the present invention has been described with respect to a limited number of embodiments, those skilled in the art will appreciate numerous modifications and variations thereof. It is intended that the appended claims cover all such modifications and variations as fall within the true spirit and scope of this present invention.

What is claimed is:

1. A method of forming a memory array that includes memory cells extending along a first direction and along a second direction, comprising:
   forming a collector layer;
   forming a plurality of collector regions in said collector layer, the collector regions being spaced apart from each other along said first direction and along said second direction;
   forming a plurality of base regions over said collector region;
   forming a plurality of emitter regions over said base regions; and
   forming a plurality of memory elements over said emitter regions, wherein said collector regions, base regions and emitter regions form heterojunction bipolar transistors.

2. The method of claim 1, wherein forming said collector regions includes forming insulating trenches in said collector layer, said collector regions being spaced apart from each other by said insulating trenches.

3. The method of claim 2, wherein forming said base regions includes forming a base layer over said collector regions and over said insulating trenches using a differential epitaxial deposition.

4. The method of claim 3, wherein said differential epitaxial deposition forms monocrystalline regions over said collector regions and polycrystalline regions over said insulating trenches, said monocrystalline regions corresponding to said base regions.

5. The method of claim 4, further comprising, after forming said polycrystalline regions, doping said polycrystalline regions.

6. The method of claim 5, wherein said polycrystalline regions are doped by outdiffusion from said insulating trenches.

7. The method of claim 5, wherein polycrystalline regions are doped with boron.

8. The method of claim 3, further including forming insulating trenches in said base layer after forming said base regions.

9. The method of claim 1, wherein said collector regions comprise n-type material, said base regions comprise p-type material and said emitter regions comprise n-type material.

10. A method of forming a memory array, the method comprising:
    forming a collector connection layer over a substrate;
    forming a collector layer over the collector connection layer;
    forming a plurality of insulating trenches, each insulating trench extending through the collector layer and into the collector connection layer thereby forming a plurality of collector regions in the collector layer;
    forming a plurality of base regions over the collector region;
    forming a plurality of emitter regions over the base regions; and
    forming a plurality of memory elements over the emitter regions, wherein the collector regions, base regions and emitter regions form heterojunction bipolar transistors.

11. The method of claim 10, wherein the memory array includes memory cells extending along a first direction and along a second direction and wherein the collector regions are spaced apart from each other along the first direction and along the second direction.

12. The method of claim 10, wherein forming the base regions comprises forming a base layer over the collector regions and over the insulating trenches using a differential epitaxial deposition process.

13. The method of claim 12, wherein the differential epitaxial deposition process forms monocrystalline regions over the collector regions and polycrystalline regions over the insulating trenches, the monocrystalline regions corresponding to the base regions.

14. The method of claim 13, further comprising, after forming the polycrystalline regions, doping the polycrystalline regions.

15. The method of claim 14, wherein the polycrystalline regions are doped by outdiffusion from the insulating trenches.

16. A method of forming a memory array, the method comprising:
    forming a plurality of memory cells arranged along a first direction and a second direction, each of the cells comprising a programmable resistance memory element electrically coupled to a heterojunction bipolar transistor, the heterojunction bipolar transistor of each of the memory cells including a collector region, the collector regions being spaced apart from each other along said first direction and along said second direction.

17. The method of claim 16, wherein the heterojunction bipolar transistor are formed by:
    forming a collector layer;
    forming the collector regions in the collector layer;
    forming a plurality of base regions over the collector regions;
    forming a plurality of emitter regions over the base regions; and
    forming a plurality of memory elements over the emitter regions.

18. The method of claim 17, wherein forming the collector regions includes forming insulating trenches in the collector layer, the collector regions being spaced apart from each other by the insulating trenches.

19. The method of claim 18, wherein the collector layer overlies a collector connection layer and wherein each insulating trench extends through the collector layer and into the collector connection layer.

20. The method of claim 18, wherein forming the base regions comprises forming a base layer over the collector regions and over the insulating trenches using a differential epitaxial deposition that forms monocrystalline regions over the collector regions and polycrystalline regions over the insulating trenches, the monocrystalline regions corresponding to the base regions.

* * * * *